United States Patent
Yamaguchi et al.

(10) Patent No.: US 8,877,653 B2
(45) Date of Patent: Nov. 4, 2014

(54) SUBSTRATE PROCESSING METHOD AND SUBSTRATE PROCESSING APPARATUS

(71) Applicant: Dainippon Screen Mfg. Co., Ltd., Kyoto (JP)

(72) Inventors: Takahiro Yamaguchi, Kyoto (JP); Akio Hashizume, Kyoto (JP); Yuya Akanishi, Kyoto (JP); Takashi Ota, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 13/729,069

(22) Filed: Dec. 28, 2012

(65) Prior Publication Data

US 2013/0175241 A1 Jul. 11, 2013

(30) Foreign Application Priority Data

Jan. 11, 2012 (JP) ................................. 2012-002772

(51) Int. Cl.
*H01L 21/302* (2006.01)
*H01L 21/461* (2006.01)
*H01L 21/00* (2006.01)
*B44C 1/22* (2006.01)

(52) U.S. Cl.
CPC ............... *B44C 1/227* (2013.01); *H01L 21/00* (2013.01)
USPC ............................ 438/745; 438/749; 438/757

(58) Field of Classification Search
CPC ................ B08B 7/04; H01L 21/02049; H01L 21/02052; H01L 21/02071; H01L 21/31116; H01L 21/67046; H01L 21/67051; H01L 21/67167; H01L 21/67236
See application file for complete search history.

(56) References Cited

U.S. PATENT DOCUMENTS

| | | | |
|---|---|---|---|
| 2001/0004898 A1 | 6/2001 | Kamikawa et al. | 134/2 |
| 2001/0045224 A1 | 11/2001 | Kamikawa et al. | 134/61 |
| 2005/0115671 A1* | 6/2005 | Araki | 156/345.12 |
| 2009/0133722 A1 | 5/2009 | Koh et al. | 134/63 |
| 2010/0071938 A1* | 3/2010 | Kuhr et al. | 174/256 |

FOREIGN PATENT DOCUMENTS

| | | |
|---|---|---|
| CN | 1179394 | 12/2004 |
| JP | 2001-015481 | 1/2001 |
| JP | 2001-176833 | 6/2001 |
| JP | 2004-281620 | 10/2004 |
| JP | 2010-118498 | 5/2010 |
| TW | 200931567 | 7/2009 |
| WO | WO 00/22654 | 4/2000 |

* cited by examiner

*Primary Examiner* — Duy Deo
(74) *Attorney, Agent, or Firm* — Ostrolenk Faber LLP (57) ABSTRACT

A solvent vapor containing a solvent material capable of dissolving hydrogen fluoride is supplied to a surface of a substrate, thereby covering the surface of the substrate with a liquid film containing solvent material. Thereafter an etching vapor containing a hydrogen fluoride is supplied to the surface of the substrate covered by the liquid film containing the solvent material, thereby etching the surface of the substrate.

7 Claims, 5 Drawing Sheets

FIG. 1

FIG. 6 Effect of IPA pre-treatment
(Selectivity and etching amount data)

FIG. 7 Effect of DIW pre-treatment
(Selectivity and etching amount data)

FIG. 8 Effect of IPA pre-treatment (Etching uniformity data)

FIG. 9 Effect of DIW pre-treatment (Etching uniformity data)

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate with a process liquid. Examples of substrates to be processed include semiconductor wafers, glass substrates for liquid crystal displays, glass substrates for plasma displays, substrates for FEDs (field emission displays), substrates for optical discs, substrates for magnet-optical discs, glass substrates for photomasks, substrates for ceramics, substrates for solar cells, etc.

2. Description of Related Art

In manufacturing processes for semiconductor devices or liquid crystal display devices, etching process for eliminating unwanted films from substrates by supplying hydrofluoric acid (water solution of hydrogen fluoride) to a substrate such as semiconductor wafer or glass substrate for liquid crystal display device or cleaning process for eliminating particles from a substrate are performed. For example, JP-A-2010-118498 discloses a substrate process method in which formation of liquid film covering a substrate surface by deionized water dispensed from a nozzle is followed by supply of hydrofluoric vapor to the substrate surface covered by deionized-water film.

However, it is difficult to form ultra-thin liquid film in order to decrease deionized-water consumption by means of nozzle dispensing of deionized water according to the teaching disclosed in JP-A-2010-118498.

SUMMARY OF THE INVENTION

Therefore, it is an object of the present invention to provide a substrate processing method and a substrate processing apparatus that can yield uniform etching while decreasing running costs.

A preferred embodiment of the present invention provides a substrate processing method comprising: a liquid film forming step for supplying a solvent vapor containing a solvent material capable of dissolving hydrogen fluoride to cover a surface of a substrate with a liquid film containing the solvent material; and an etching step for supplying an etching vapor containing a hydrogen fluoride to the surface of the substrate covered by the liquid film containing the solvent material.

The solvent vapor may be a solvent material vapor (a gas vaporized from a solid or liquid solvent material), or may be a vapor containing a vaporous or misty solvent material and a carrier gas (for example, inert gas). Likewise, the etching vapor may be a hydrofluoric vapor, or may be a vapor containing a vaporous or misty hydrofluoric, and a carrier gas.

According to this method, a solvent vapor containing a solvent material is supplied to a surface of a substrate. The solvent vapor condenses at the surface of the substrate to form a liquid film with uniform thickness. Thereby the surface of the substrate is covered by a liquid film containing the solvent material. Thereafter under this condition, an etching vapor containing hydrogen fluoride is supplied to the surface of the substrate. The solvent material is a material capable of dissolving hydrogen fluoride. Accordingly, hydrogen fluoride contained in the etching vapor dissolves into the liquid film on the substrate to disperse throughout the liquid film. Thereby uniform etching of the surface of the substrate is achieved. Because the solvent material is supplied to a substrate in vapor or mist form according to the method described hereinabove, it is possible to cover the surface of the substrate with a solvent material smaller in amount than in a case wherein the solvent material is supplied in liquid form. Furthermore, because ultra-thin liquid film can be formed on a substrate according to the method, it is possible to decrease amount of liquid over a substrate. For this reason, it is possible to increase hydrofluoric density in a liquid film to a density required for etching, using a small amount of etching vapor. Thus it is possible to decrease consumption amount of solvent vapor and etching vapor. Thereby it is possible to achieve uniform etching over a substrate while decreasing running cost.

The solvent material may be a material capable of dissolving hydrogen fluoride and water. Specifically, the solvent material may be water (for example, deionized water) or an organic compound that will be described below.

Because the solvent material is capable of dissolving not only hydrogen fluoride but also water, adsorbed water partially attached on substrate surface will dissolve into the solvent material on the substrate to be dissipated in the liquid film in this case. Thereby the surface of the substrate shifts from a condition wherein water is partially attached thereon into a condition wherein liquid film with uniform thickness covers thereof. Thus the condition of the surface of the substrate is adjusted. Under this condition, an etching vapor is supplied to the surface of the substrate.

Etching of a substrate with hydrogen fluoride is processed under an environment wherein water exists. According to a research of the inventors of the present invention, it is found that a supply of an etching vapor to a surface of a substrate with water partially attached thereon makes the water-attached parts more susceptible to etching, decreasing the overall etching uniformity. Thus, by supplying etching vapor to a surface of a substrate with adjusted condition thereof, it is possible to inhibit or prevent the surface of substrate from being partially etched to deteriorate roughness condition thereof. Thereby it is possible to improve etching uniformity.

The solvent material may be a material capable of dissolving hydrogen fluoride and water, and be also an organic compound having a boiling point below that of water. Specifically, the solvent material may be an organic compound that contains at least one of ethanol, methanol, IPA (isopropyl alcohol), acetone, acetic acid, methane, ethane, propane, or butane.

In this case, solvent vapor containing an organic compound as a solvent material is supplied to a surface of a substrate. The organic compound is, as well as being capable of dissolving hydrogen fluoride and water, also has a boiling point lower than that of water. Thus even if adsorbed water is attached on the substrate surface, it would dissolve into the organic compound on the substrate, and then would evaporate along with the organic compound, thereby eliminating water from the substrate. Likewise, even if organic substance is attached on the substrate surface, it would evaporate along with the organic compound to be eliminated from the substrate. According to a research by the inventors of the present invention, supplying etching vapor to a substrate surface in a condition that organic substance is attached thereon may result in decrease of etching uniformity. Thus it is possible to further improve etching uniformity by eliminating organic substance from a substrate.

The etching step may include a step for supplying the etching vapor containing a hydrogen fluoride and the solvent material to a surface of the substrate covered by the liquid film.

According to this method, an etching vapor containing hydrogen fluoride and solvent material is supplied to a surface of a substrate covered with a liquid film containing solvent material. In other words, an etching vapor containing a substance that is same as the one that is on the substrate, is supplied to the surface of the substrate. Accordingly an etching vapor having high compatibility with liquid on a substrate is supplied to a surface of a substrate. The etching vapor supplied to the surface of the substrate adsorbs on the surface of the substrate to form condensed phase containing hydrogen fluoride. According to a research by the inventors of the present invention, it is found that the degree of adsorption of etching vapor depends on the substrate wettability. Furthermore, according to a research of the inventors of the present invention, it is found that, by supplying an etching vapor containing hydrogen fluoride and solvent material, it is possible to form a condensed phase containing hydrogen fluoride more uniformly on a substrate than in a case that etching vapor containing only hydrogen fluoride is supplied. Therefore, it is possible to improve etching uniformity by supplying an etching vapor containing hydrogen fluoride and solvent material to a surface of a substrate.

The substrate processing method may further comprise a repetition step for repeating a cycle including the liquid film forming step and the etching step more than one times.

According to this method, solvent vapor and etching vapor are alternately supplied. The etching vapor is supplied to the surface of the substrate covered with a liquid film containing solvent material. The liquid film on the substrate gradually evaporates due to the supplying of the etching vapor. Thus it is possible to replenish solvent material on a substrate by interrupting the supply of etching vapor to supply solvent material again. This inhibits or prevents the substrate from being supplied of etching vapor in such a state that the surface of the substrate is partially exposed. Thereby it is possible to inhibit or prevent decrease of etching uniformity.

The substrate processed by the substrate processing method may be a substrate on a surface of which a nitride film is formed.

In this case, etching vapor is supplied to a surface of a substrate with a nitride film thereon being covered with a liquid film containing solvent material. The nitride film is etched by the etching vapor; this makes it possible to uniformly etch the nitride film.

Also, the substrate processed by the substrate processing method may be a substrate on a surface of which nitride film and oxide film are formed.

In this case, etching vapor is supplied in a state that nitride film and oxide film on a surface of a substrate is covered with a liquid film containing solvent material. Etching rate (amount of etching per unit time), or etching velocity is lower in case with oxide film than in case with nitride film. Furthermore, according to a research of the inventors of the present invention, it is possible to inhibit or prevent excessive etching of oxide film by covering a surface of a substrate with liquid film to adjust surface condition thereof. Accordingly, it is possible to increase etching selectivity, or etching rate of nitride film divided by that of oxide film, by supplying etching vapor to a surface of a substrate in such a condition that nitride film and oxide film on the substrate is covered with a liquid film containing solvent material.

The liquid film forming step is preferably a step for supplying the solvent vapor to a surface of a substrate in a closed space. Likewise, the etching step is preferably a step for supplying the etching vapor to a surface of a substrate in a closed space. Supplying of solvent vapor and etching vapor may be performed in the same chamber, or may be performed in separate chambers. That is, supplying of solvent vapor and etching vapor may be performed in the same enclosed space, or may be performed in separate enclosed spaces. In either case, it is possible to supply solvent vapor and etching vapor to a substrate, enabling to decrease amount of consumption of solvent vapor and etching vapor.

Furthermore, the liquid film forming step may include a step for supplying the solvent vapor containing either one of the organic compound and water to a surface of a substrate; and the etching step may include a step for supplying the etching vapor containing another one of the organic compound and water and a hydrogen fluoride to the substrate covered with the liquid film containing the one of the organic compound and water. Etching vapor containing an organic compound and hydrogen fluoride may be supplied to a substrate, for example, after solvent vapor containing water is supplied to the substrate.

As described hereinabove, an organic compound is, as well as capable of dissolving water, highly volatile. Due to this, upon supplying an organic compound to a substrate, water on the substrate evaporates along with the organic compound, decreasing amount of water on the substrate. On the other hand, supplying of water to a substrate increases amount of water on the substrate. Hydrogen fluoride reacts with a substrate under an environment wherein water exists to etch the substrate. An optimum range exists for amount of water required for the etching. Consequently it is possible to control the amount of water on a substrate by varying amount of organic compound and water supplied to a substrate. Thereby it is possible to inhibit or prevent decrease of etching rates.

In another preferred embodiment of the present invention provides a substrate processing apparatus comprising: a substrate holding unit for holding a substrate; a solvent vapor supply unit for supplying a solvent vapor containing a solvent material capable of dissolving hydrogen fluoride to a surface of the substrate held by the substrate holding unit; an etching vapor supply unit for supplying an etching vapor containing hydrogen fluoride to the surface of the substrate held by the substrate holding unit; and a control equipment for performing a liquid film forming step for supplying the solvent vapor to the surface of the substrate by controlling the solvent vapor supply unit to cover the surface of the substrate with a liquid film containing the solvent material and an etching step for supplying the etching vapor to the surface of the substrate covered by the liquid film containing the solvent material by controlling the etching vapor supply unit. It is possible to A configuration according to this can have the similar effects as in described hereinabove.

The solvent vapor supply unit may supply the solvent vapor containing the solvent material, in which hydrogen fluoride and water can be dissolved, to a surface of a substrate held by the substrate holding unit. According to this configuration, it is possible to have the similar effects as in described hereinabove.

The solvent vapor supply unit may supply the solvent vapor containing an organic compound as the solvent material, in which hydrogen fluoride and water can be dissolved, to a surface of a substrate held by the substrate holding unit. According to this configuration, it is possible to have the similar effects as in described hereinabove.

The etching vapor supply unit may include a mixing unit for generating a mixed vapor containing the solvent vapor and the etching vapor by mixing the solvent vapor and the etching vapor, to lead the mixed vapor to a substrate held by the substrate holding unit. In this case, the control equipment may carry out the etching step containing a step for supplying the mixed vapor to the surface of the substrate covered with a liquid film containing the solvent material. According to this configuration, it is possible to have the similar effects as in described hereinabove.

The control equipment may carry out a repetition step for repeating a cycle including the liquid film forming step and the etching step more than one times. According to this configuration, it is possible to have the similar effects as in described hereinabove.

The aforementioned and other objects, features, and effects of the present invention shall be clarified by the following description of a preferred embodiment with references to the accompanying drawings.

DETAILED DESCRIPTION OF PREFERRED EMBODIMENTS

Figure 1:
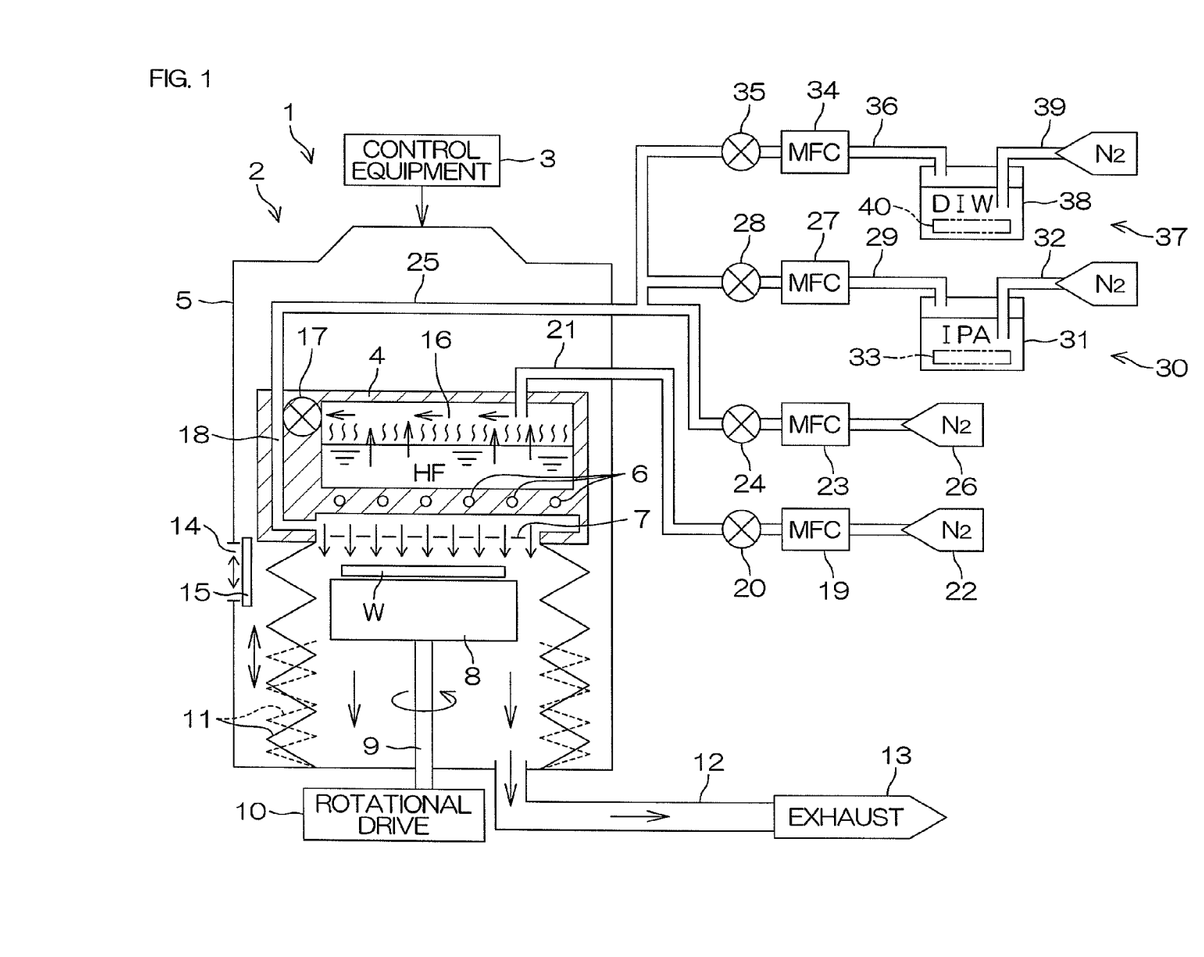
FIG. 1 is a schematic diagram illustrating overview configuration concerning a preferred embodiment of the present invention.

FIG. 1 is a schematic diagram illustrating overview configuration concerning a preferred embodiment of the present invention.

A substrate processing apparatus 1 is a single-sheet type substrate processing apparatus, which processes disk-shaped substrates, such as wafer and the like, one wafer at a time. The substrate processing apparatus 1 comprises a process unit 2 for processing a substrate W and a control equipment 3 for controlling performances of equipments provided in the substrate processing apparatus 1 and controlling open/close of valves.

The process unit 2 is a vapor process unit for supplying a vapor containing a hydrogen fluoride to a substrate W. The process unit 2 comprises a HF vapor generation container 4 for reserving hydrofluoric acid, an etching vapor supply unit, and a chamber 5 for accommodating the HF vapor generation container 4. Density of hydrofluoric acid is adjusted to densities that give so-called pseudo-azeotrope composition (for example, about 39.6 percent under at one standard atmospheric pressure, at room temperature). Hydrofluoric acid in the vapor generation container 4 is heated by a HF heater 6 embedded in the container 4. Temperature of hydrofluoric acid in the HF vapor generation container is controlled by the control equipment 3.

The process unit 2 further comprises a perforated plate 7 disposed below the vapor generation container 4 and a hot plate 8 disposed below the perforated plate 7. The hot plate 8 is an example of the substrate holding unit for holding a substrate W, as well as an example of substrate heater heating a substrate W. The hot plate 8 holds the substrate W horizontally with upper face of a substrate W opposing to the perforated plate 7. Substrate W is held as being heated by the hot plate 8. Temperatures of the substrate W are maintained at given values within a given range (for example, 30 to 100 degrees Celsius). The hot plate 8 is fixed on the upper end of a rotational axis 9. Rotation of the rotational axis 9 actuated by a rotational drive mechanism 10 including motor and the like causes the hot plate 8 to rotate around perpendicular axis in synchronization with the axis 9. Thereby the substrate W held by the hot plate 8 rotates about a perpendicular axis passing through the center thereof.

The treatment unit 2 further comprises a tubular bellows 11 disposed at peripheral of the hot plate 8. The bellows 11 can be vertically elongated or contracted. A drive mechanism not shown elongates/contracts the bellows 11 between a seal position (shown in solid line) at which space surrounding the hot plate 8 is sealed and a retract position (shown in broken line) at which upper end of the bellow is under the upper face of the hot plate 8. Interior space of the bellows 11 is connected to an exhaust equipment 13 via an exhaust pipe 12 connected to the bottom face of the chamber 5. Air in the bellows 11 is exhausted by the exhaust equipment 13.

Also, the chamber 5 includes a shutter 15 for open/close a opening 14 configured on a side wall thereof. The opening 14 is disposed at a lateral side of the hot plate 8. Transfer of a substrate W into the process unit 2 is preceded by a disposition of the bellows 11 at the retract position (shown in broken lines) and opening of the opening 14. And then in this condition, a substrate W is carried into the chamber 5 by a transfer robot (not shown) for transporting substrates. Thereafter the opening 14 is closed by the shutter 15. On the other hand, when a substrate W is carried out of the chamber 5, the bellows 11 is disposed at the retract position and the opening 14 is opened. And then in this condition, a substrate W is carried out of the chamber 5 by the transfer robot. Thereafter the opening 14 is closed by the shutter 15.

The HF vapor generation container 4 comprises a vapor generation space 16 filled with a fluoric acid vapor (gas generated through evaporation of fluoric acid) and a flow path 18 (mixing unit) connected with the vapor generation space 16 via a communication valve 17. The HF vapor generation container 4 is connected to a first pipe 21 interposed with a first flow rate controller 19 and a first valve 20. The HF vapor generation container 4 is connected to a first nitrogen gas supply source 22 via the first pipe 21. Nitrogen gas which is an example of carrier gas or inert gas, is supplied to a vapor generation space 16 via the first pipe 21. Likewise, a flow path 18 is connected to a second pipe 25 interposed with a second flow rate controller 23 and a second valve 24. The flow path 18 is connected to a second nitrogen gas supply source 26 via a second pipe 25. Nitrogen gas is supplied to the flow path 18 via the second pipe 25.

The second pipe 25 is connected to a third pipe 29 (solvent vapor supply unit) interposed with a third flow rate controller 27 and a third valve 28. The third pipe 29 is connected to the second pipe 25 on the downstream side (the side of flow path 18) of the second valve 24. The flow path 18 is connected to a IPA vapor supply unit 30 via the second pipe 25 and the third pipe 29. The IPA vapor supply unit 30 comprises a IPA tank 31 reserving IPA (in liquid form) and a gas pipe 32 for supplying nitrogen gas in the IPA tank 31. The third pipe 29 is connected to the IPA tank 31. Nitrogen gas supplied into the IPA tank 31 through the gas pipe 32 causes bubbles in the tank 31, generating IPA vapor (gas including mist IPA and nitrogen gas). Thereafter IPA vapor flows into the third pipe 29 from the IPA tank 31. In case that the organic solvent reserved in the IPA tank 31 is an incombustible organic solvent, the IPA vapor supply unit 30 may be configured, not limited in the aforementioned configuration, such that a heater 33 (shown in alternate long and two short dashes lines) evaporates the organic solvent in the IPA tank 31.

IPA is an example of an organic compound being capable of dissolving hydrogen fluoride and water, and having a lower boiling point than that of water, with relatively small molecular weight.

The second pipe 25 is connected to a fourth pipe 36 (solvent vapor supply unit) interposed with a fourth flow path controller 34 and a fourth valve 35. The fourth pipe 36 is connected to the second pipe 25 on the downstream side of the second valve 24. The flow path 18 is connected to a DIW vapor supply unit 37 via the second pipe 25 and a fourth pipe 36. The DIW vapor supply unit 37 includes a DI (deionized) water tank 38 deionized water (in liquid form) reserving DI water (in liquid form), and a gas pipe 39 for supplying nitrogen gas into the tank 38. The fourth pipe 36 is connected to the DI water tank 38. Supplying of nitrogen gas through the gas pipe 39 into the DI tank 38 prompts bubbles thereinside, generating DIW vapor (gas containing mist DI water and nitrogen gas.) Thereafter DIW vapor flows from the DI tank 38 into the third pipe 29. The DIW vapor supply unit 37 may be configured, not limited to the aforementioned configuration, such that a heater 40 (shown in alternate long and two short dashes lines) evaporates DI water in the DI tank 38 to generate DIW vapor.

A communication valve 17, the first valve 20, the second valve 24, the third valve 28, and the fourth valve 35 are opened/closed by a control equipment 3. With the communication valve 17 and the first valve 20 opened, hydrofluoric acid vapor floating in the vapor generation space 16 is supplied into the flow path 18 via the communication valve 17 due to flow of nitrogen gas from the first nitrogen gas supply source 22. Therefore, in a condition that the communication valve 17, the first valve 20, and the second valve 24 are opened and the third valve 28 and the fourth valve 35 are closed, nitrogen gas flow from the second nitrogen gas supply source 26 leads HF vapor (gas containing hydrofluoric acid vapor and nitrogen gas) supplied into the flow path 18 into the perforated plate 7. Thereby through a multitude of through-holes, HF vapor is blown onto the upper face of a substrate W held by the hot plate 8.

Also, in a condition that the third valve 28 is opened, IPA vapor from the IPA vapor supply unit 30. Likewise, in a condition that the fourth valve 35 is opened, DIW vapor from the DIW vapor supply unit 37 is supplied into the flow path 18. Therefore, in a condition that either one of the third valve 28 and the fourth valve 35 is opened, and the communication valve 17, the first valve 20 and the second valve 24 are closed, IPA vapor or DIW vapor is blown onto the upper face of a substrate W. On the other hand, in a condition that either one of the third valve 28 and the fourth valve 35 is opened, and the communication valve 17, the first valve 20 and the second valve 24 are opened, IPA vapor or DIW vapor and HF vapor are mixed in the flow path 18, causing vapor containing IPA or deionized water and hydrogen fluoride to be blown onto the upper face of the substrate W. Also, in a condition that all the valve 17, 20, 24, 28, and 35 are opened, IPA vapor, DIW vapor and HF vapor are mixed in the flow path 18, causing vapor containing IPA, deionized, and hydrogen fluoride to be blown onto the upper face of a substrate W.

Next, an example of processing of substrate W performed by the substrate processing apparatus 1 will be described hereinafter. Specifically, selective etching will be described, wherein vapor containing hydrogen fluoride is supplied onto a surface of a silicon substrate, with LP-SiN (Low Pressure-Silicon Nitride) thin film as an example of nitride film and LP-TEOS (Low Pressure-Tetraethyl ortho-silicate) thin film as an example of oxide film being formed thereon, to selectively etch the LP-SiN thin film. The oxide film may be, not limited to TEOS thin film, an thermally-oxidized film; or may be an oxide film in silicate glass system.

Figure 2:
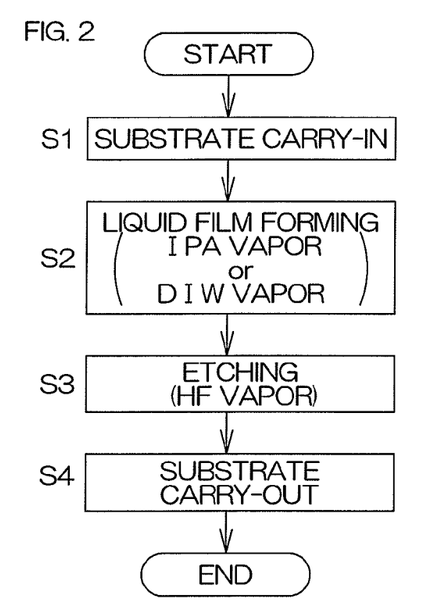
FIG. 2 is a flowchart for explaining a first processing example.

FIG. 2 is a flowchart for explaining a first processing example. FIG. 1 and FIG. 2 are referred to hereinbelow.

When a substrate W is processed by the process unit 2, substrate carry-in step (S1) for carrying the substrate into the substrate unit 2. Specifically, the control equipment 3 causes transfer robot to carry a substrate W into the process unit 2. Thereafter, the control equipment 3 opens the second valve 24 in a condition that the bellows 11 in disposed at a seal position (shown in solid lines) and the exhaust equipment 13 is activated. Thereby nitrogen gas is supplied from the second pipe 25 into the flow path 18, then be supplied from the perforated plate 7 into the bellows 11. Air in the bellows 11 is exhausted through suction power exerted by the exhaust equipment 13, and is also pushed out to the exhaust pipe 12 by nitrogen gas supplied into the bellows 11. Thereby the air in the bellows 11 is replaced with nitrogen gas. After the replacement of the air in the bellows 11 with nitrogen gas, the control equipment 3 closes the second valve 24.

Next, a liquid film forming step as a preprocess procedure, for supplying IPA vapor or DIW vapor to a substrate W, is performed (S2). Specifically, the control equipment 3 rotates a substrate W held by the hot plate 8 by means of the rotational drive mechanism 10, under a condition that the substrate W is kept at a given temperature by the hot plate 8. Thereafter the control equipment 3 opens the third valve 28 or the fourth valve 35, with the communication valve 17, the first valve 20, and the second valve 24 closed. Thereby IPA vapor or DIW vapor is supplied into the flow path 18. The supplied IPA vapor or DIW vapor flows via through-holes, being blown onto the substrate W that is rotating and kept at a certain temperature by hot plate 8. After a predetermined time, the third valve 28 or the fourth valve 35 being opened, the control equipment halts supply of IPA vapor or DIW vapor to the substrate W by closing the third valve 28 or the fourth valve 35.

IPA vapor or DIW vapor passing through the through-holes of the perforated plate 7 causes the space in the bellows (sealed space) to be filled with IPA vapor or DIW vapor, supplying IPA vapor or DIW vapor onto a substrate W on the hot plate 8. Thereby IPA vapor or DIW vapor condenses on the substrate W. When IPA vapor is supplied onto a substrate W, high affinity of IPA vapor with water causes adsorbed water on the substrate W to dissolve in IPA thereon. Likewise, when DIW vapor is supplied onto a substrate W, adsorbed water dissolves in deionized water. Therefore, liquid film that is ultra thin, and also has small thickness variation is formed. Furthermore, when IPA vapor is supplied onto a substrate W, adsorbed water thereon evaporates because of high volatility of IPA, to be eliminated from the substrate W. Thereby amount of water on a substrate W is adjusted. Furthermore, since IPA is an organic compound with high volatility, organic substance on the substrate W evaporates along with IPA, to be eliminated from the substrate W. As is described hereinabove, surface condition of a substrate W is modified by supply of IPA vapor or DIW vapor, from a condition that foreign matter such as water or organic substance is partially attached thereon to a condition that liquid film with uniform thickness covers thereover. Thereby surface condition of substrate W is adjusted.

Next, an etching step for supplying HF vapor onto a substrate W is performed (S3). To be specific, the control equipment 3 opens the communication valve 17, the first valve 20, and the second valve 24 under a condition that the third valve 28 and the fourth valve 35 are closed. Thereby HF vapor is supplied to the flow path 18, thereafter, passes through through-holes of perforated plate 7 to be blown onto the substrate W which is in a rotating condition and is maintained at a given temperature by the hot plate 8. This allows HF vapor to be supplied onto the substrate W on which liquid film forming step as a preprocess procedure is performed. After a predetermined time since opening of the communication valve 17, the first valve 20, and the second valve 24, the control equipment 3 halts supplying of HA vapor to the substrate W by closing the communication valve 17, the first valve 20, and the second valve 24.

When HF vapor passes through the through-holes of perforated plate 7, the space inside of the bellows 11 is filled with HF HF vapor. Thereby a condensed phase containing hydrogen fluoride and water which selectively etches a nitride film on the substrate W. When HF vapor is supplied to a nitride film in a condition that foreign substance such as water or organic substance are partially attached thereon, parts over which foreign substance are attached becomes more vulnerable to etching, resulting in possible occasional debasement of etching uniformity. Likewise as for oxide film, when HF vapor is supplied under similar condition, unwanted parts of oxide film could be etched, degrading etching selectivity. As is described above, it is possible to improve uniformity and selectivity of etching by supplying HF vapor to a surface of a substrate W in a condition that surface condition of the substrate W is adjusted.

Next, a substrate carry-out step for carrying a substrate out of the process unit 2 is performed (S4). Specifically, the control equipment 3 opens the second valve 24, thereby nitrogen gas is supplied into the bellows 11. Air in the bellows 11, in other words, HF vapor floating inside the bellows 11 or gas generated through etching, is exhausted by the exhaust pipe 12 due to the suction power exerted by the exhaust equipment 13, as well as pushed by nitrogen gas supplied into the bellows. Thereby the air in the bellows is replaced with nitrogen gas. After the replacement, the control equipment 3 closes the second valve 24. Thereafter the control equipment 3 causes the transfer robot to carry the transfer W out of the process unit 2.

Figure 3:
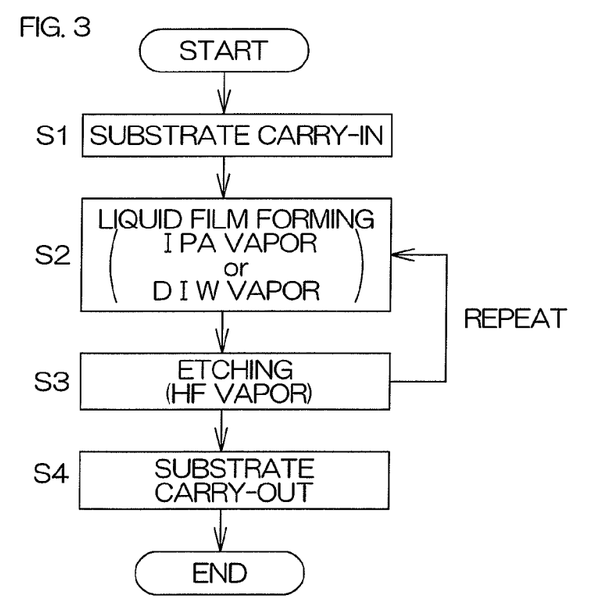
FIG. 3 is a flowchart for explaining a second processing example.

FIG. 3 is a flowchart for explaining a second processing example. FIG. 1 and FIG. 3 are referred to hereinbelow.

A major difference between the first process example and the second process example is, the latter repetitively performs the liquid film forming step (S2) and etching step (S3).

To be specific, in the second process example, in a similar manner of the first process example, the substrate carry-in step (S1), the liquid film forming step (S2), and the etching step (S3) is sequentially performed. Thereafter the liquid film forming step (S2) and the etching step (S3) is performed again. That is, in the second process example, a cycle from the liquid film forming step (S2) to the etching step (S3) is repetitively performed. And then after the performance of the liquid film forming step (S2) and the etching step (S3) for several times, the substrate carry-out step (S4) is performed in likewise manner as in the first process example, carrying the already-processed substrate W out of the process unit 2. The vapor supplied in the liquid film forming step (S2) performed for the second time and thereafter may either be of the same or different type versus that in the liquid film forming step (S2) performed for the first time. For example, IPA vapor and DIW vapor may be supplied to the substrate W in the liquid film forming step, respectively as for the first time and as for the second time and thereafter.

In the etching step (S3), HF vapor is supplied to the surface of the substrate W covered with a liquid film of IPA or deionized water. IPA or deionized water on the substrate W gradually evaporates due to the supply of HF vapor. Furthermore, in order to control etching rates for different types of films such as nitride film or oxide film, and to improve etching selectivity, the substrate W is heated by the hot plate 8 in the etching step (S3); therefore accelerating evaporation of IPA or deionized water. Therefore, IPA or deionized water can be replenished by halting supply of HF vapor to a substrate W to supply IPA vapor or DIW vapor to the substrate W again. Consequently it is possible to inhibit or prevent HF vapor, in a condition that surface of substrate W is partially exposed, from being supplied to substrate W. Thereby it is possible to inhibit or prevent the uniformity and selectivity of etching from decreasing.

Figure 4:
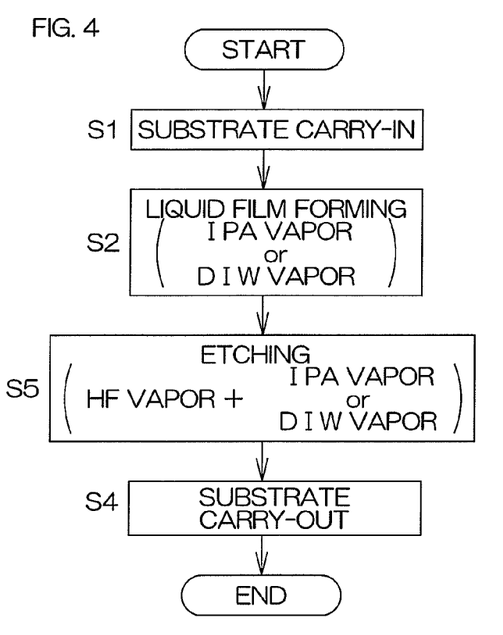
FIG. 4 is a flowchart for explaining a third processing example.

FIG. 4 is a flowchart for explaining a third processing example. FIG. 1 and FIG. 4 are referred to hereinbelow.

A major difference between the first process example and the third process example is that in the latter case, not only HF vapor, but also a mixed vapor containing IPA vapor or DIW vapor is supplied to the substrate W.

Specifically, in the third process example, in likewise manner as in the first process example, the substrate carry-in step (51) and the liquid film forming step (S2) are sequentially performed. Thereafter the etching step, wherein HF vapor and either IPA vapor or DIW vapor are simultaneously supplied to the substrate W, is performed (S5). Specifically, the control equipment 3 opens the communication valve 17, the first valve 20, and the second valve 24. Furthermore, the control equipment 3 opens the third valve 28 and the fourth valve 35. Thereby HF vapor and either IPA vapor or DIW vapor are supplied to the flow path 18 and mixed therein. Consequently the mixed vapor containing HF vapor and either IPA vapor or DIW vapor passes through-holes of the perforated plate 7, to be blown onto the substrate W which is maintained at a certain temperature by the hot plate 8 and in a rotational condition. After supplying of mixed vapor to the substrate W for a given time, the control equipment 3 halts supplying of the mixed vapor to the substrate W by closing all of the valve 17, 20, 24, 28, and 35. Thereafter, in likewise manner as in the first process example, the substance carry-out step (S4) is performed to carry the already-treated substrate W out of the process unit 2 by the transfer robot.

The mixed vapor supplied to the substrate W in the etching step (S5) may be a vapor containing a vapor of same type versus that supplied to the substrate W in the liquid film forming step (S2), or may be a vapor containing a vapor of different type versus that supplied to the substrate W in the liquid film forming step (S2). Specifically, in case that IPA vapor is supplied in liquid film forming step (S2), the mixed vapor supplied to the substrate W in the etching step (S5) may be either a vapor containing HF vapor and IPA vapor, or a vapor containing HF vapor and DIW vapor. Supplying of DIW vapor in the liquid film forming step (S2) is performed in likewise manner. Adsorption of HF vapor on a surface of a substrate W is dependent on wettability of the surface of the substrate. Therefore when only HF vapor is supplied to a substrate W, there might be a case that condensed phase containing hydrogen fluoride is not uniformly formed over the substrate W. In light of this, by supplying the mixed vapor to the substrate W, it is possible to uniformly form a condensed phase over the substrate W, improving etching uniformity.

Figure 5:
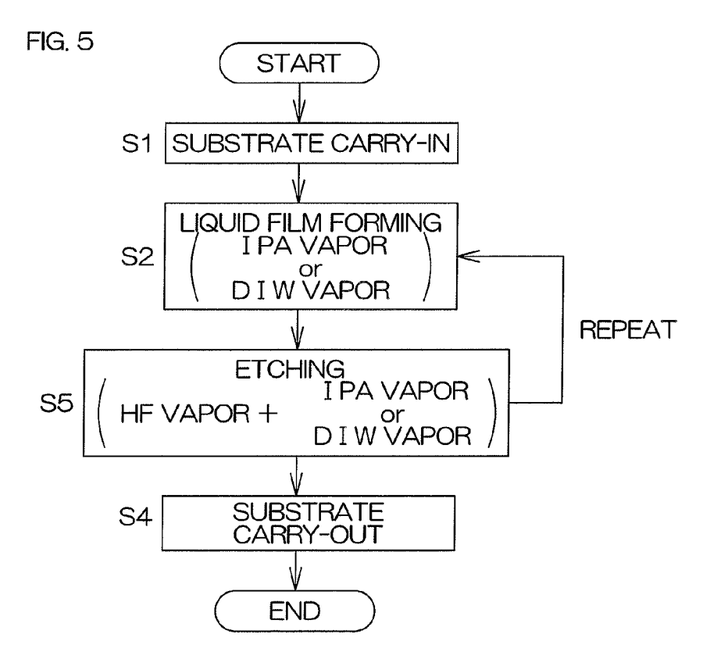
FIG. 5 is a flowchart for explaining a fourth processing example.

FIG. 5 is a flowchart for explaining a fourth processing example. FIG. 1 and FIG. 5 are referred to hereinbelow.

A major difference between the third process example and the fourth process example is, the liquid film forming step (S2) and the etching step (S5) is repetitively performed in the latter case.

To be specific, in the fourth process example, in the same manner as in the third process example, the substrate carry-in step (S1) and the etching step (S5) are sequentially performed. Thereafter, the liquid film forming step (S2) and the etching step (S5) are performed again. That is, in the fourth process example, a cycle from the liquid film forming step (S2) to etching step (S5) is repeatedly performed. And then after the performance of the liquid film forming step (S2) and the etching step (S3) for several times, the substrate carry-out step (S4) is performed in likewise manner as in the third process example, to carry the already-processed substrate W out of the process unit 2. The vapor supplied in the liquid film forming step (S5) performed for the second time and thereafter may either be of the same or different type versus that supplied in the liquid film forming step (S5) performed for the first time. For example, a mixed vapor containing HF vapor and IPA vapor may be supplied to the substrate W in the etching step performed for the first time; and a mixed vapor containing HF vapor and DIW vapor may be supplied to the substrate W in the etching step performed for the second time and thereafter.

Figure 6:
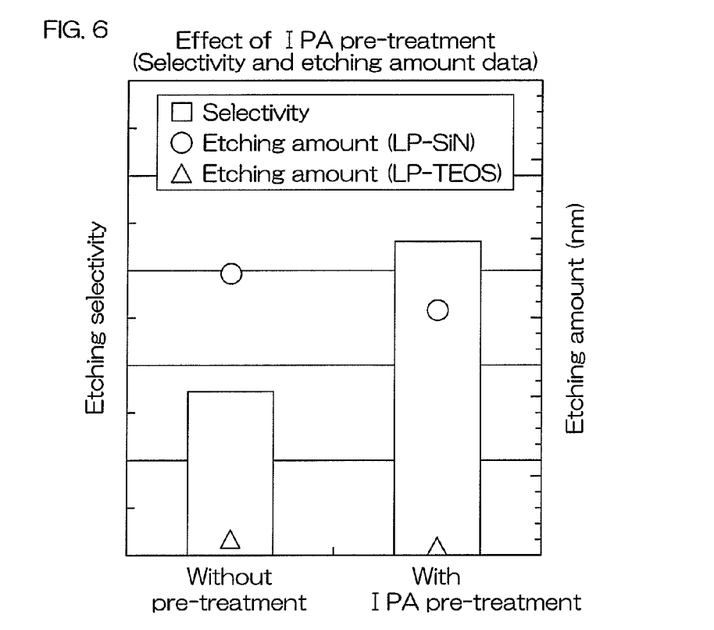
FIG. 6 is a graph showing etching selectivity and etching amount for a case in which IPA vapor is supplied and a case in which IPA vapor is not supplied to a substrate prior to performing etching step.
Figure 7:
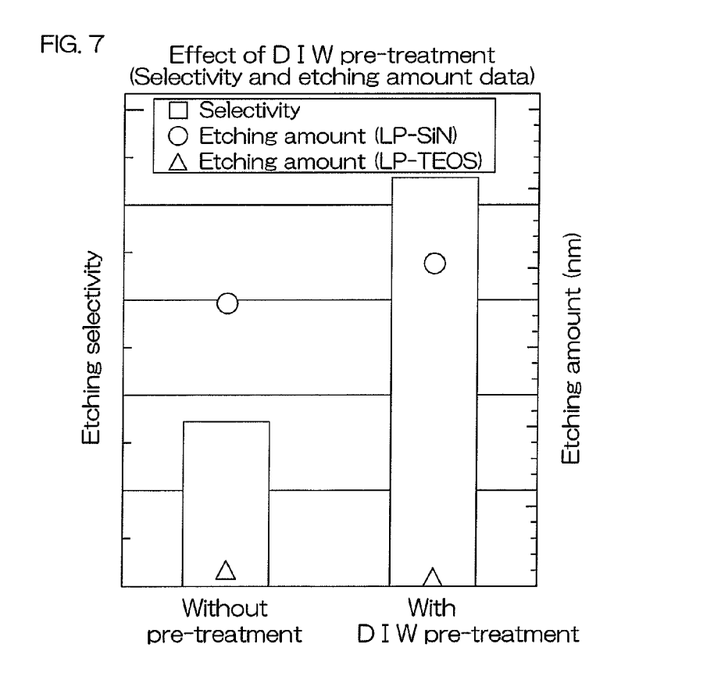
FIG. 7 is a graph showing etching selectivity and etching amount for a case in which DIW vapor is supplied and a case in which DIW vapor is not supplied to a substrate prior to performing etching step.

FIG. 6 is a graph showing etching selectivity and etching amount for a case in which IPA vapor is supplied and a case in which IPA vapor is not supplied to a substrate prior to performing etching step. FIG. 7 is a graph showing etching selectivity and etching amount for a case in which DIW vapor is supplied and a case in which DIW vapor is not supplied to a substrate prior to performing etching step.

Figure 8:
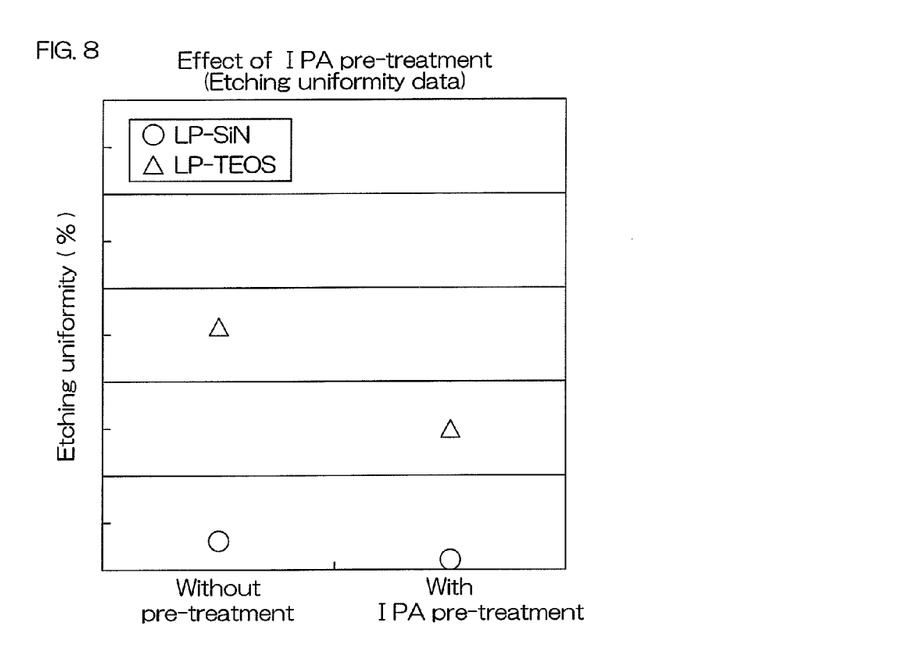
FIG. 8 is a graph showing etching uniformity for a case in which IPA vapor is supplied and a case in which IPA vapor is not supplied to a substrate prior to performing etching step.
Figure 9:
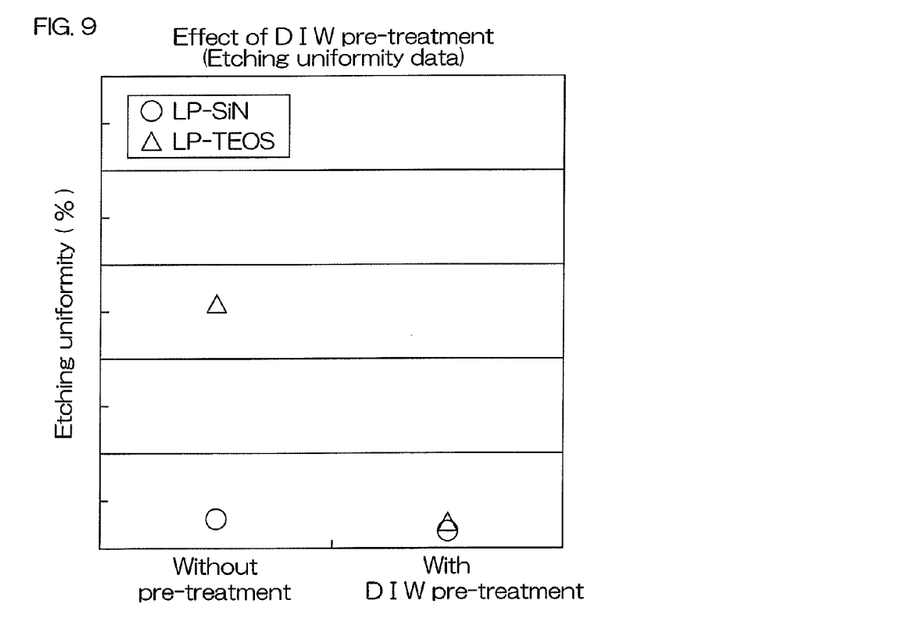
FIG. 9 is a graph showing etching uniformity for a case in which DIW vapor is supplied and a case in which DIW vapor is not supplied to a substrate prior to performing etching step.

FIG. 8 is a graph showing etching uniformity for a case in which IPA vapor is supplied and a case in which IPA vapor is not supplied to a substrate prior to performing etching step. FIG. 9 is a graph showing etching uniformity for a case in which DIW vapor is supplied and a case in which DIW vapor is not supplied to a substrate prior to performing etching step.

Measurement values shown in FIG. 6 to FIG. 9 are the values measured when a substrate W with a LP-SiN thin film, which is an example of nitride film, and LP-TEOS thin film, which is an example of oxide film, are processed according to the aforementioned first example of processing. Etching amount shown in FIG. 6 and FIG. 7 are mean values for etching amounts obtained from a plurality of positions on a surface of a substrate W. Etching uniformity shown in FIG. 8 and FIG. 9 are standard deviations divided by respective mean values. Lower the value (in percentages) etching uniformity means higher the uniformity.

As shown in FIG. 6 as circle points, etching amounts of LP-SiN in case pretreatments are performed utilizing IPA vapor decreases than that without pretreatments. As shown in FIG. 6 as triangular points, etching amounts of LP-TEOS in case pretreatments are performed utilizing IPA vapor are decreased to in the order of half than that without pretreatments. Since, with the pretreatments, the etching amounts of LP-TEOS are decreased to in the order of half, etching selectivity (etching amounts of LP-SiN divided by etching amounts of LP-TEOS) increases to almost twice of that without the pretreatments.

Also as shown in FIG. 7 as circle points, etching amounts of LP-SiN in case pretreatments are performed utilizing DIW vapor increase than that without pretreatments. As shown in FIG. 7 as triangular points, etching amounts of LP-TEOS in case pretreatments are performed using DIW vapor decrease to in the order of half than that without pretreatments. In addition to the decrease of the etching amounts of LP-TEOS to in the order of half, amounts of etching of LP-SiN are increased, which translate into the increase of etching selectivity in case pretreatments are performed using DIW vapor to more than twice of that without the pretreatments (see bar graph in FIG. 7).

Also, as shown in FIG. 8 as circle points, uniformity values of LP-SiN in case pretreatments are performed using IPA vapor are decreased than that without pretreatments. As shown in FIG. 8 as triangle points, uniformity values (in percentage) of LP-TEOS in case pretreatments are performed using IPA vapor are decreased than that without pretreatments. Accordingly, in either of LP-SiN and LP-TEOS films, etching uniformity is improved.

Also, as shown in FIG. 9 as circular points, uniformity values (in percentage) of LP-SiN in case pretreatments are performed using DIW vapor are decreased than that without pretreatments. As shown in FIG. 9 as triangular points, uniformity values (in percentage) of LP-TEOS in case pretreatments are performed using DIW vapor are also decreased (to about one-tenth) than that without pretreatments. Accordingly in either of LP-SiN and LP-TEOS films, etching uniformity is improved by applying pretreatments.

As described hereinabove, in either cases of using IPA vapor and DIW vapor, improvement on etching selectivity and uniformity are achieve by applying pretreatments.

As described hereinabove, in the present preferred embodiment, IPA vapor or DIW vapor are supplied to a substrate W before HF vapor is supplied to the substrate W; thereby forming ultra-thin liquid film over the substrate W to adjust surface condition thereof. Accordingly, HF vapor is to be supplied to a substrate W with surface condition thereof adjusted. As described hereinabove, when HF vapor is supplied to a substrate W with foreign substances such as water or organic substances partially attached, the parts wherein the foreign substances are attached become more susceptible to etch, degrading etching uniformity. Moreover, in early stage of HF vapor supplying to the substrate W, formation of condensed phase of HF vapor tends to be localized to offer degradation of etching uniformity, regardless of foreign substances. Therefore, it is possible to improve etching uniformity by supplying HF vapor to a substrate W with surface condition thereof being adjusted.

Furthermore, the supplying IPA or DIW in vapor form allows them to cover the whole of a substrate surface with less amount of IPA or DIW than supplying IPA or DIW in liquid form. Furthermore, the ability to form an ultra-thin liquid film can result in a decrease of amount of liquid consumed. Thereby with relatively small amount of HF vapor, it is possible to increase hydrofluoric density in a liquid film up to a density required etching. Therefore it is possible to decrease consumption amount of IPA vapor, DIW vapor, or HF vapor; thereby it is possible to uniformly etch a substrate W while decreasing running cost.

Although the preferred embodiments of the present invention have been described in detail, it should be clear for those skilled in the art that the present invention may be put into practice in other modes within the limit of the appended claims.

For example, in the aforementioned first to fourth process examples, explanations are given for cases in which a substrate with a nitride film and an oxide film formed thereon is processed. Yet in the first to fourth process examples, a substrate with either one of a nitride film or an oxide film thereon may be processed. Naturally, a substrate with a thin film other than nitride film or oxide film formed thereon may be processed, or a substrate with no thin film thereon may be processed.

Furthermore, in the first to fourth process examples, cases are explained wherein both the liquid film forming step and the etching step are performed in the same chamber. Yet the liquid film forming step and the etching step may be performed in separate respective chambers.

Also, in the first to fourth process examples, cases are explained wherein IPA vapor, DIW vapor, and HF vapor are supplied to a rotating substrate. But IPA vapor, DIW vapor, and HF vapor may be supplied to a stand-still substrate.

Also, concerning the etching step in the third and fourth process examples, cases are explained wherein two types of vapors (HF vapor and either IPA vapor or DIW vapor) are supplied to a substrate. But three types of vapors (IPA vapor, DIW vapor and HF vapor) may be supplied to a substrate. In this case, IPA vapor, DIW vapor, and HF vapor may be supplied separately to a substrate, or may be supplied with at least two of IPA vapor, DIW vapor, and HF vapor mixed together.

Also, in the aforementioned preferred embodiment, explanations are made for a case wherein hydrofluoric acid (hydrofluoric water solution) is reserved in a HF vapor generation container. Yet in a case wherein HF vapor is supplied to a substrate in a condition surface thereof covered with a liquid film containing water, or in a case wherein HF vapor and DIW vapor are simultaneously supplied to a substrate, anhydrous hydrofluoric acid having more than 99.9 percent density, may be reserved in the HF vapor generation container instead.

Also, whereas in the aforementioned preferred embodiment, a case is explained wherein the substrate processing apparatus is an apparatus for processing disk-shaped substrates; the substrate processing apparatus may process polygonal shaped substrates, such as substrates for liquid crystal displays.

Other modifications in design may be possible within the scope of the present invention recited in the appended claims.

Although the preferred embodiments of the present invention have been described in detail, the embodiments are merely specific examples used to clarify the technical contents of the present invention, and the present invention should not be understood as being limited to these specific examples; and the scope of the present invention is limited solely by the appended claims.

The present application corresponds to Japanese Patent Application No. 2012-002772 filed in the Japan Patent Office on Jan. 11, 2012 the entire disclosure of which is incorporated herein by reference.

What is claimed is:

1. A substrate processing method comprising:
    a liquid film forming step of supplying a solvent vapor containing a solvent material capable of dissolving hydrogen fluoride onto a surface of a substrate so that the solvent vapor condenses on the surface of the substrate to form a uniform liquid film containing the solvent material;
    an etching step of supplying an etching vapor containing a hydrogen fluoride to the surface of the substrate covered by the liquid film containing the solvent material; and
    are repetition step of repeating a cycle including the liquid film forming step and the etching step more than one time.

2. The substrate processing method according to claim 1, wherein the solvent material is a material capable of dissolving hydrogen fluoride and water.

3. The substrate processing method according to claim 2, wherein the solvent material is an organic compound having a boiling point below that of water.

4. The substrate processing method according to claim 1, wherein the etching step includes a step of supplying the etching vapor containing a hydrogen fluoride and the solvent material to the surface of the substrate covered by the liquid film.

5. The substrate processing method according to claim 1, wherein the substrate is a substrate on a surface of which a nitride film is formed.

6. The substrate processing method according to claim 5, wherein the substrate is a substrate on a surface of which a nitride film and an oxide film are formed.

7. The substrate processing method according to claim 1, wherein the substrate is one of a semiconductor wafer, a glass substrate for a liquid crystal display, and a substrate for a solar cell.

* * * * *

UNITED STATES PATENT AND TRADEMARK OFFICE
CERTIFICATE OF CORRECTION

Page 1 of 1

PATENT NO. : 8,877,653 B2
APPLICATION NO. : 13/729069
DATED : November 4, 2014
INVENTOR(S) : Takahiro Yamaguchi et al.

It is certified that error appears in the above-identified patent and that said Letters Patent is hereby corrected as shown below:

In the Claims

Claim 1 at column 14, line 23, "are" should read --a--.

Signed and Sealed this
Twenty-first Day of April, 2015

Michelle K. Lee
*Director of the United States Patent and Trademark Office*